United States Patent
Sekihara

(10) Patent No.: US 9,766,538 B2
(45) Date of Patent: Sep. 19, 2017

(54) PELLICLE FRAME AND A PELLICLE

(71) Applicant: SHIN-ETSU CHEMICAL CO., LTD., Tokyo (JP)

(72) Inventor: Kazutoshi Sekihara, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 123 days.

(21) Appl. No.: 14/941,804

(22) Filed: Nov. 16, 2015

(65) Prior Publication Data

US 2016/0154300 A1    Jun. 2, 2016

(30) Foreign Application Priority Data

Dec. 1, 2014    (JP) .................................. 2014-242786

(51) Int. Cl.
  *G03F 1/62*    (2012.01)
  *G03F 1/64*    (2012.01)

(52) U.S. Cl.
  CPC ...................... *G03F 1/64* (2013.01)

(58) Field of Classification Search
  None
  See application file for complete search history.

(56) References Cited

U.S. PATENT DOCUMENTS 6,195,153 B1    2/2001    Shimizu
7,098,996 B1 *  8/2006    Berman et al. ........... G03F 1/62
                                                                    355/52
2010/0271602 A1 * 10/2010  Hanazaki ................. G03F 1/62
                                                                    355/30
2010/0328641 A1   12/2010  Shirasaki et al.
2010/0330466 A1   12/2010  Shirasaki et al.
2010/0330467 A1   12/2010  Shirasaki et al.

FOREIGN PATENT DOCUMENTS

| EP | 1 829 836 A1 | 9/2007 |
|----|----|----|
| JP | 10-198039 A | 7/1998 |
| JP | 2000-47390 A | 2/2000 |
| JP | 2007-176782 A | 7/2007 |
| JP | 2011-7933 A | 1/2011 |
| JP | 2011-7934 A | 1/2011 |
| JP | 2011-7935 A | 1/2011 |

OTHER PUBLICATIONS

Eric P. Cotte, et al., "Effects of Soft Pellicle Frame Curvature and Mounting Process on Pellicle-Induced Distortions in Advanced Photomasks", Optical Microlithography XVI, Proceedings of SPIE, vol. 5040, (2003), pp. 1044-1054.

E.P. Cotte, et al., "Distortions in advanced photomasks from soft pellicles", Microelectronic Engineering, Elsevier Science B.V., (2002) vol. 187, No. 192., pp. 187-192.

(Continued)

*Primary Examiner* — Stephen Rosasco
(74) *Attorney, Agent, or Firm* — Westerman, Hattori, Daniels & Adrian, LLP

(57) ABSTRACT

A pellicle frame and a pellicle made with it is proposed in which at least one pair of the side bars of the frame are made to have a deflection (bow) which has an amount or a distance of displacement measured at the middle point of the side bar accounting for 0.01 through 1% of the length of the respective side bar.

12 Claims, 5 Drawing Sheets

(56) References Cited

OTHER PUBLICATIONS

Christopher Lee, "Investigation of Pellicle Influence on Reticle Flatness", Photomask and Next-Generation Lithography Vlask Technology XII, SPIE, vol. 5853, pp. 516-524.
Minoru Fujita, et al., "Pellicle-Induced Distortions in Advanced Photomasks", Photomask and Next-Generation Lithography Mask Technology IX, SPIE, vol. 4754, (2002), pp. 589-596.
European Search Report dated Apr. 19, 2016, issued in counterpart European Patent Application No. 15194993.0 (9 pages).

* cited by examiner

PELLICLE FRAME AND A PELLICLE

The present non-provisional patent application claims priority, as per Paris Convention, from Japanese Patent Application No. 2014-242786 filed on Dec. 1, 2014, the disclosure of which is hereby incorporated by reference herein in its entirety.

FIELD OF THE INVENTION

The present invention relates to a pellicle frame as well as a pellicle made with this pellicle frame, useful as a dust-fender employed in the scenes of manufacturing semiconductor devices, IC packages, printed circuit boards, liquid crystal display panels, organic EL display panels, etc.

BACKGROUND TECHNOLOGY

In manufacturing semiconductor devices such as LSI and super-LSI or in manufacturing a liquid crystal display panel or the like, a circuit pattern is made by irradiating a ultraviolet light to a semiconductor wafer or a glass plate for liquid crystal, but if a dust particle is sticking to a photomask used in this stage, the dust particle obstructs or reflects the ultraviolet light, causing deformation, short circuit or the like in the pattern being transferred, and such phenomena would lead to lowering of the quality of the end products.

Thus, these works are usually performed in a clean room, but, even in a clean room, it is yet difficult to keep the photomask clean all the time. Hence, the exposure light irradiation is conducted only after a pattern-including part of the surface of the photomask is sheltered by a pellicle as a dust fender. Under such circumstances, foreign particles do not directly adhere to the surface of the photomask, but only onto the pellicle membrane, and thus by setting a photo focus at a pattern on the photomask at the time of lithographing, the foreign particles on the pellicle membrane do not affect the transferred image.

In general, a pellicle is built up of a pellicle frame, which is made of an aluminum alloy, a stainless steel, an engineering plastic or the like, and a transparent pellicle membrane made of cellulose nitrate, cellulose acetate, a fluorine-containing polymer or the like which transmit light well; this pellicle membrane is adhered to an upper one of the two annular faces of the pellicle frame. On a lower one of the annular faces of the frame is laid an agglutinant layer made of a polybutene resin, a polyvinyl acetate resin, an acrylic resin, a silicone resin or the like for attaching the pellicle frame to the photomask, and over this agglutinant layer is laid, if need be, a releasable liner (separator) for protecting the agglutinant layer.

In recent years, owing to the increased refinement of the exposure light pattern, the problem of the deformation of the photomask caused by pellicle adhesion to it has become more focused. This problem occurs as the photomask and the pellicle are coupled together via the agglutinant layer, whereby the form of the pellicle frame affects that of the photomask, and thus the pattern described on the surface of the photomask is deformed from the original form; consequently, a kind of pellicle which induces very little change in the shape of the photomask as it is adhered to the photomask is called for.

Various countermeasures have been proposed to solve this problem: for example, the mask-boding agglutinant layer is made softer, or the flatness of the pellicle frame is improved. These proposed methods can reduce the effect the pellicle frame shape imparts to the photomask shape, but the result is not necessarily sufficient. This is on account of the fact that the flatness of the pellicle frame and that of the photomask are not perfect and, depending on the combinations of them the magnitude of the effect imparted by the pellicle frame shape to the photomask shape is diversified.

It is theoretically preferable that a pellicle frame is easy to deform so as to readily imitate the shape of the photomask, which is enabled through reduction of the rigidity of the pellicle frame as much as permissible; and proposals have been made as to how to do this, such as a use of a material of low rigidity like resin, or lowering the height of the pellicle frame, or modifying the cross section of the frame's side bar to reduce its cross-sectional area whereby the rigidity of the frame is reduced. (ref. IP Publications 1, 2 and 3)

On the other hand, in most exposure apparatuses, the photomask is held horizontally during the exposure stage, so that there has been a problem of deflection of the photomask induced by its own weight during this stage. When an excessive deflection occurs in the photomask, the pattern for exposure described on its surface incurs deformation, and cannot effect exposure of the pattern as designed. In order to solve this problem, methods are proposed such as: as a normal method the thickness of the photomask is increased in relation to the size of the photomask to thereby restrict the amount of the self-weight deflection to a predetermined value (ref. IP Publication 4); or in cases of large-sized exposure apparatuses the deflection of the photomask is corrected by means of application of a negative pressure or the like (ref. IP Publication 5); or anticipating the effect of the self-weight deflection of the photomask, it is cancelled in the optical system (ref. IP Publication 6).

Based on an assumption that the photomask is normally made perfectly flat, the pellicle or pellicle frame is also made as flat as possible, so that the higher the flatness of the pellicle frame is, the better it is considered; however the fact is that during use (during exposure) the flatness of the photomask (which degrades due to deflection) and that of the pellicle are not necessarily the same. Hence, in order to bring the flatness of each of these closer to each other even during the exposure, a consideration is made to increase the plate thickness of the photomask further so as to minimize the self-weight deflection; but this measure has a problem of pushing up the cost and the weight of the photomask since it is made of costly and heavy synthetic quartz.

As a different measure, it is possible to substantially reduce the rigidity of the pellicle frame so as to allow the pellicle frame to assimilate itself to the shape of the photomask. However, preferably the rigidity of the pellicle frame is as high as possible, so as to maintain tenseness of the pellicle membrane it bears, and also to prevent the pellicle frame from undergoing deformation during stages such as its manufacturing and its adhesion to the photomask, which causes the pellicle membrane to have wrinkles; therefore, a measure of substantially reducing the rigidity of the pellicle frame faces problems in manufacturing and handling. For this reason, this measure has a limit in that the rigidity of the pellicle frame cannot be reduced very much.

As explained above, during the exposure operation, the photomask has a deflection caused by the weight of itself; however, in fact the shape of the photomask coupled with the pellicle during the exposure operation is a complex result of two elements: one the deformation of the photomask purely caused by its self-weight, and the other the deformation of the photomask purely induced by the shape of the pellicle, and these two shapes resisting each other bring about the resulting deflection or the shape of the photomask;

and it is noted that no pellicle frame or pellicle have been designed based on a consideration of this complex effect that the pellicle will give to the photomask during the exposure operation.

PRIOR ART PUBLICATIONS

IP Publications

[IP Publication 1]
Japanese Patent Application Publication No. 2011-7933
[IP Publication 2]
Japanese Patent Application Publication No. 2011-7934
[IP Publication 3]
Japanese Patent Application Publication No. 2011-7935
[IP Publication 4]
Japanese Patent Application Publication No. 2007-176782
[IP Publication 5]
Japanese Patent Application Publication H10-198039 (1998)
[IP Publication 6]
Japanese Patent Application Publication No. 2000-47390

SUMMARY OF THE INVENTION

Problems the Invention Seeks to Solve

The present invention was contrived in view of the above-stated circumstances, and it is an object of the invention to provide a pellicle frame and a pellicle using this frame which are, while easy to manufacture and handle, capable of reducing the changes in deformation or deflection that the photomask undergoes when it is coupled with the pellicle and held horizontally during the exposure operation Means to Solve the Problems The present inventor worked hard to attain the above-described object, and found that if the pellicle frame is made to have a deflection in at least one pair of its side bars in the same or opposite direction by a similar amount—as measured at the middle points of the side bars—as the deflection which the photomask would have when it is deflected purely by its self-weight, then the pellicle made with such a pellicle frame, when coupled with the photomask, causes the change in the deformation (deflection) of the photomask between before and after the coupling, to be minimum—hence the possession of the invention.

In other words, the pellicle frame of the present invention is a rectangular pellicle frame having a pair of longer side bars and a pair of shorter side bars, which is characteristic in that at least one pair of the side bars are made to have a deflection which has an amount (namely, the distance of displacement measured at the middle point of the bar in a direction vertical to the plane of the pellicle membrane) accounting for 0.01 through 1% of the length of the respective side bar.

It is preferable that the amount of the deflection relative to the length of the side bar of the pellicle frame falls within the range of plus/minus 30% of the ratio of the maximum self-weight deflection of the photomask in the area overlapped by the pellicle to the applicable side length of the photomask, to which the pellicle is adhered, ([the maximum self-weight deflection of the photomask]/[the side length of the photomask]); and the direction of this pre-deflection of the pellicle frame is preferably such that when coupled with the photomask the direction of the pre-deflection is identical to the direction in which the photomask deflects by its self-weight, and it is also preferable that the height of the pellicle frame is in the range of 2 through 10 mm.

And, the pellicle of the present invention is characteristic in that it is made with the pellicle frame pre-deflected in the above-described particular manner.

Effect of the Invention

According to the present invention, the pellicle frame is deflected beforehand in a manner such that the pellicle made with it, when adhered to the photomask, suppresses the change in the deflection of the photomask, so that the pattern described on the photomask is prevented from changing, whereby the cancellation of the effect of the self-weight deflection of the photomask in the optical system may not be interfered.

EXAMPLE TO EMBODY THE INVENTION

Here, examples of practicing the present invention are explained; but be it known that the present invention is applicable to all kinds of pellicle frames and pellicles, in any size and for any application, that can be adhered to a photomask which can be deflected by its own weight in an exposure apparatus. In particular, the pellicle frame of the present invention is applicable to from smaller ones such as a pellicle with a side length of about 150 mm or so used in a high technology semiconductor manufacturing where the deformation of the photomask constitutes a critical problem, to larger ones such as a pellicle with a side length of 500-2000 mm used in a manufacturing of liquid crystal panel and organic EL display panel where the photomask undergoes a significant self-weight deflection.

Figure 1:
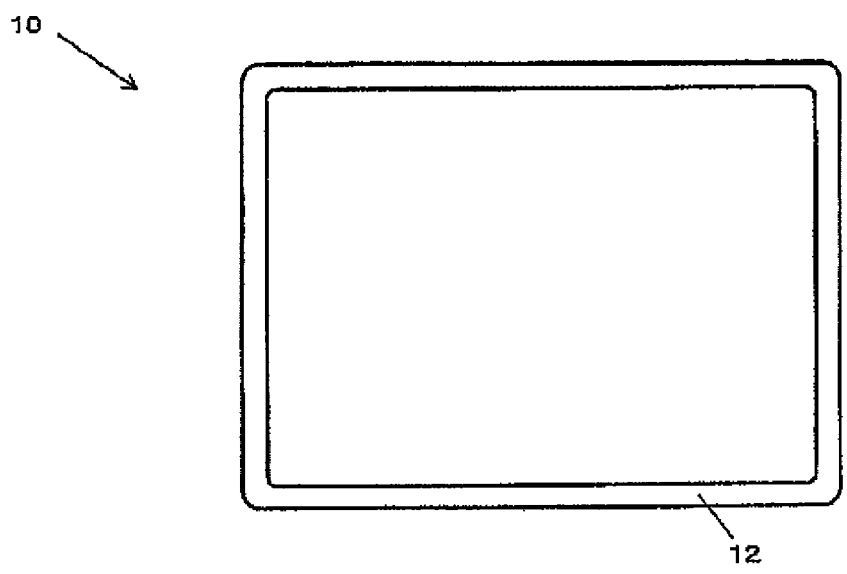
[FIG. 1]
A plan view showing an embodiment of the pellicle frame according to the present invention.
Figure 2:
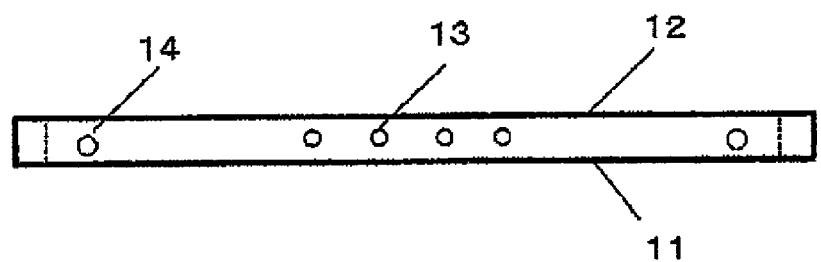
[FIG. 2]
A front view showing an embodiment of the pellicle frame according to the present invention.
Figure 3:
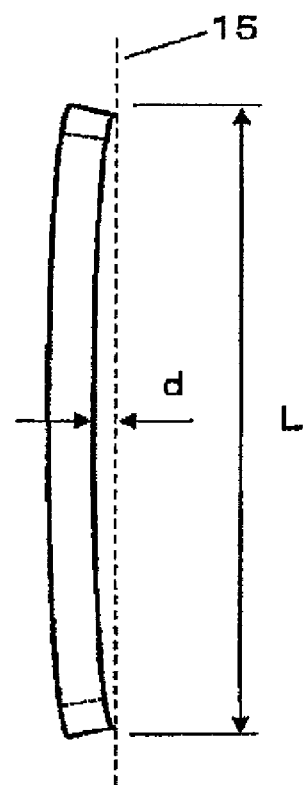
[FIG. 3]
A right-hand side view showing an embodiment of the pellicle frame according to the present invention.

FIG. 1, FIG. 2 and FIG. 3 show one embodiment of the pellicle frame of the present invention. FIG. 1 is its plan view, FIG. 2 is its front view, and FIG. 3 is its right-hand side view.

A pellicle frame 10 is rectangular having a pair of long side bars and a pair of short side bars, of which the side bars of at least one pair are deflected in a direction vertical to the annular face to which a pellicle membrane is to be bonded. In this embodiment, as shown in FIG. 3, the deflection is given to the short side bars, and the amount of the deflection d is preferably in the range of 0.01-1% of a before-deflection length L of the short side bar. The amount of defection d to be given is determined in response to the amount of deflection of a photomask to which the pellicle is to be adhered, as described later, but if the deflection amount given is as small as 0.01% or less of the side bar length, it would not produce a sufficient effect, and since the processed amount will be so small that it becomes difficult to conduct a stabilized frame manufacturing. On the other hand, if the deflection amount given exceeds 1% of the side bar length, such deflection would affect adversely the application procedures of the agglutinant layer and the adhesive layer as well as membrane bonding procedure during the pellicle manufacturing stage, and thus it is unfavorable.

Figure 4:
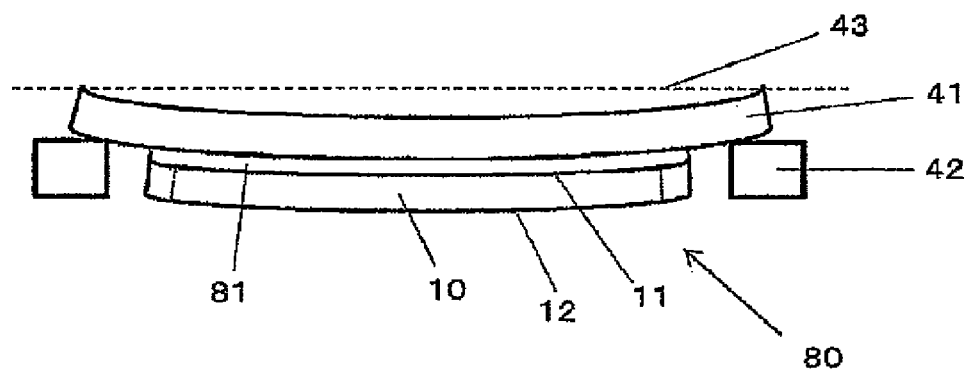
[FIG. 4]
A cross-sectional view showing an embodiment of the pellicle in use according to the present invention.

The direction of the deflection of the side bars of the pellicle frame is preferably the same as the direction in which the photomask deflects by its self-weight when the photomask is supported by a photomask support means 42. FIG. 4 is a cross-sectional view of a photomask coupled with a pellicle of the present invention at the time of exposure operation. As is shown in FIG. 4, the photomask 41 is supported by the photomask support means 42 at a pair of side bars, and is deflected by its self-weight. The reference numeral 43 in FIG. 4 denotes a line that represents an imaginary plane that contains the upper edges of the ends of the side bars being deflected, so that it is seen that the photomask 41 is defected downward. And on this occasion, if the pellicle frame 10, which is a constituent of the pellicle 80, is pre-deflected in the same direction as the photomask 41 is deflected by the self-weight (that is, downward, as seen in FIG. 4), the amount of the influence that the pellicle 80, which is adhered to the photomask 41, imparts to the shape of the photomask 41 can be suppressed to a small degree.

The more similar the amount of the deflection and the shape of the deflection of a pellicle frame 10 are to those of a self-weight deflection of a photomask 41 to which the pellicle frame 10 is adhered, the smaller the influence of the pellicle 80 imparted to the photomask 41 will be. However, in industrial situation, it is very difficult to manage and control the pellicle frames in response to the different deflections of individual photomasks with precision, so that in practice it is suggested to control and manage only the amount of the deflection.

The ratio of the deflection amount of a side bar of the pellicle frame 10 to the original length of the side bar ([defection amount]/[side bar length of the pellicle 10]) is especially preferable if it falls within the range of plus/minus 30% of the ratio of the maximum self-weight deflection of the photomask 41 taken from the area overlapped by the pellicle to the applicable side length of the photomask 41 ([the maximum self-weight deflection of the photomask]/[the side length of the photomask]). Therefore, if the manner of the self-weight deflection of the photomask 41 differs depending on whether the photomask is supported by its long sides or by its short sides, then the deflection given to the pellicle frame 10 bars should also differ accordingly between its long side bars and its short side bars. If the above-defined ratio of the pellicle frame deflection is more than 30% less than the above-defined ratio of the photomask deflection, then the effect of the deflection given to the pellicle frame will be insufficient. On the other hand, if the above-defined ratio of the pellicle frame deflection is more than 30% greater than the above-defined ratio of the photomask deflection, then the pellicle would induce the photomask to further bow in the direction of its self-weight deflection, and also the force that endeavors to peel off the agglutinant layer of the pellicle from the photomask, especially at the middle part of the side bars of the pellicle, increases substantially—hence unfavorable.

The photomask 41 is usually supported by a pair of its sides, as shown in FIG. 4, but the invention is applicable in the same manner as above to other cases as well in which, for example, the support is provided to all sides or all corners of the photomask 41.

Figure 5:
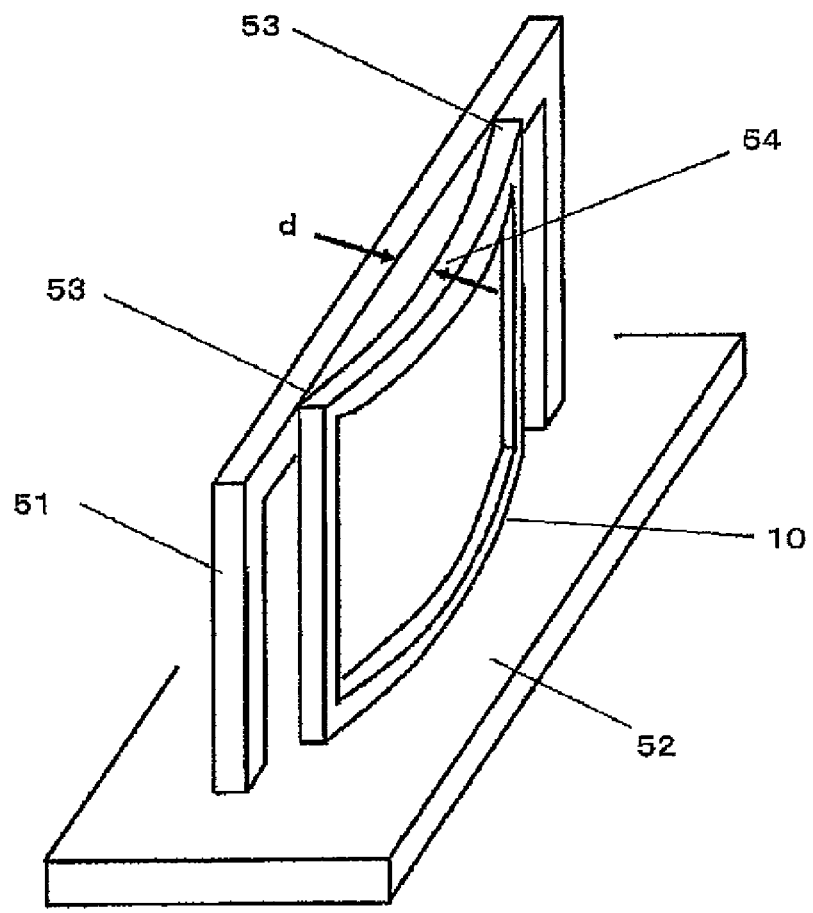
[FIG. 5]
A perspective view for an explanation of how a deflection may be measured of the pellicle frame according to the present invention.

FIG. 5 is a drawing showing how the deflection of the pellicle frame 10 of the present invention may be measured. First, the pellicle frame 10 is put to stand vertically on a standard face 52 with its side bar to be measured coming at the top and contacting at its ends 53 with a support means 51 also standing vertically to the standard face 52; then the deflection amount d of the side bar of the pellicle frame 10 being measured is obtained by measuring the distance between the side bar and the support means 51 at the middle point 54 of the side bar.

Incidentally, although not shown in FIG. 5, a means for preventing a fall of the pellicle frame 10 such as hook(s) is provided to stop the vertically disposed side bar(s). A vernier micrometer may be used as a means to measure the deflection amount d, but it is preferable to use non-contact measurement device such as a laser distance sensor. When measurement of this side bar is completed, then the pellicle frame 10 is turned and the same measurement is repeated on another side bar.

The pellicle frame 10 can be made of any known conventionally used materials such as a metal, a resin, and a fiber reinforced resin, but among these metals such as an aluminum alloy, a brass, a steel, or a stainless steel are preferred. In the case in which a pellicle frame 10 is made of a resin, it is possible to give the predetermined deflection to the resin frame by using a mold whose molding surface is shaped with such deflection so that the resulting frame has it, or it is possible to give the predetermined deflection to the resin frame by pressing at high temperatures the frame after it is molded; but a resin frame is unstable with temperature and humidity so that it is difficult to control its deflection amount and hence it does not make a preferable pellicle frame. In the case in which a pellicle frame 10 is made of a metal, the deflection is given by a deform means such as a press, of which the details will be described later.

It is preferable that the surface of the pellicle frame 10 is matted to a degree of Ra=1 micrometer or smaller by a surface treatment means such as sandblasting. In the case of an aluminum allow frame, it is preferable to apply to it an alumite (anodizing) treatment or a chemical conversion treatment; in the case of other metals, it is preferable to render treatments such as plating to impart to the frame anti-rust and dust-proof characteristics; also it is preferable that the color of the frame is black. Furthermore, in place of these inorganic treatments to the surface, it is also good to apply a coating layer of a light-resistant material such as fluorine-containing resin, acrylic resin and silicone resin; it is good too to put such an organic layer on top of the inorganically treated surface.

If need be, it is possible to provide the pellicle frame 10 with vent holes 13, as shown in FIG. 2, which penetrate a frame bar for ventilation of the interior of the pellicle, or to provide non-penetrant handling holes 14 and grooves (not shown) for the purpose of handling of the pellicle. It is also good to describe on the surface of the pellicle frame 10 a model number, a serial number and a bar code by means of mechanical engraving or laser marking. Furthermore, although the external shape of the pellicle frame 10 in this embodiment is rectangular, the invention encompasses cases where the pellicle frame 10 has other polygonal shapes, such as a polygonal frame which is made by replacing the four corners of a rectangular frame with short askance side bars. The cross section of the side bar of the pellicle frame 10 is rectangular in this embodiment, but it can be trapezoidal or it can have a chamfer.

Incidentally, in the case of a pellicle frame 10 which has a low rigidity against a bending force applied in the direction of its height, since the pellicle frame 10 can deflect with little resistance to copy the defection of the photomask, the effect of the present invention does not contribute much in such cases. Examples of the pellicle frame 10 of which the rigidity in the height direction is low include ones made of a material which has a low elastic modulus such as resin and ones which has low height. In the case of a pellicle frame 10 which has a low rigidity, it is difficult to control the amount of the deflection of the frame on the occasion of imparting a predetermined deflection to it, and hence it becomes difficult to make the frame with the predetermined deflection; consequently, it is preferable that the height of the pellicle frame 10 is 2 mm through 10 mm. Herein, the "height" of the pellicle frame is the distance between the faces 11 and 12, which are shown in FIG. 2.

There are various ways to impart deflection to the pellicle frame 10, and this invention does not limit the way to be adopted. One example is to first make a deflection-free pellicle frame 10 and then give the deflection to it at a later stage.

Figure 6:
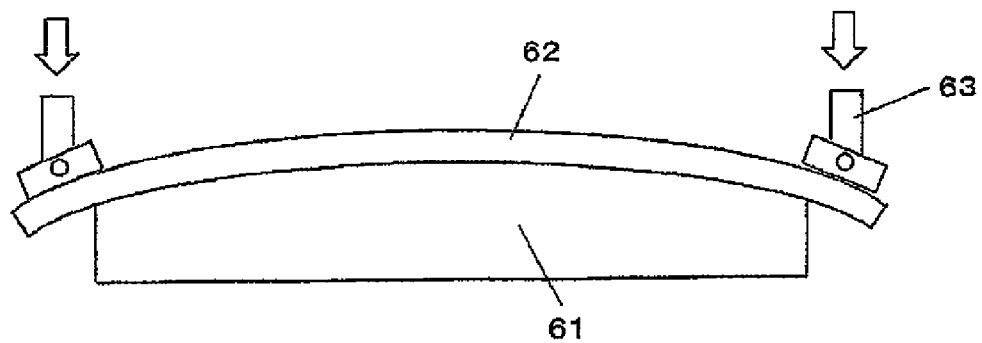
[FIG. 6]
A view for an explanation of how a deflection is given to the pellicle frame according to the present invention.

FIG. 6 is a drawing to show an example of how a deflection is given to a pellicle frame. A pellicle frame 62 is laid over a molding surface of a deformation processing mold 61 having a predetermined deflection in its molding surface; then the pellicle frame 62 is pressed against the molding surface by a press means 63 having rotary heads which imparts load to a pair of side bars of the pellicle frame 62 whereby the pellicle frame 62 is deformed to have the desired deflection. In this method, an advantageous point is that the load required for the processing can be small. The press means 63 can be one that is operated by hydraulic pressure or pneumatic pressure, or it can be one whose pushing mechanism employs a screw, or even the press means can be human hands. It is possible that the press means 63 has equipped with other pressing heads so that it can press the other side bars of the pellicle frame 62 besides the ones being pressed in FIG. 6.

In this manner of processing there is a tendency that the pellicle frame springs back to some extent after the deformation processing, so that it is appropriate to design the molding surface of the deformation processing mold 61 with an adjustment so as to cancel out the effect of this spring back phenomenon, based on data from many experiments. Also, since this processing is conducted at a stage where the manufacture of the pellicle frame is nearly completed, the surface of the pressing heads of the press means should be properly treated lest it damage the quality of the appearance of the pellicle frame by giving scars or the like.

Figure 7:
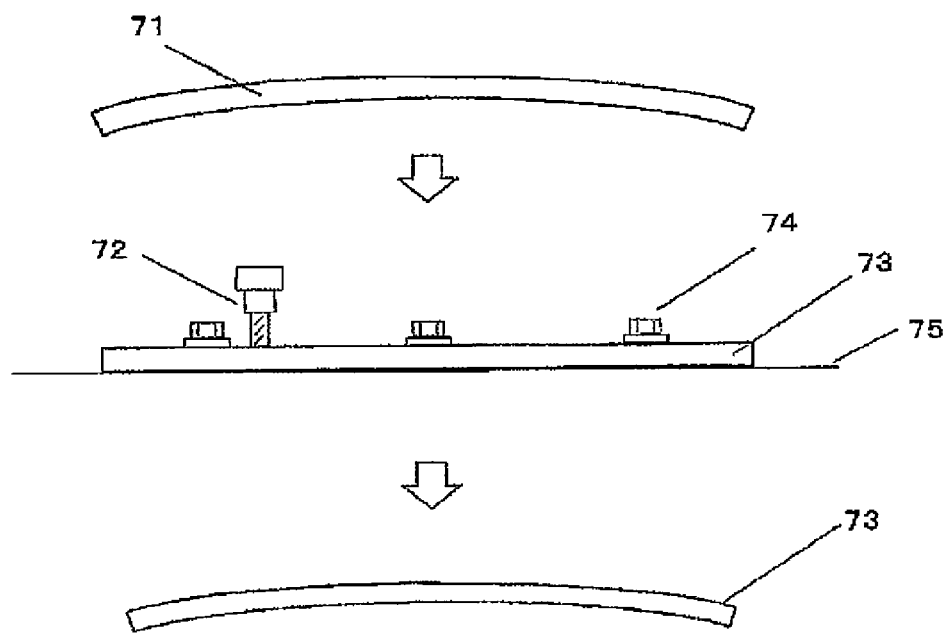
[FIG. 7]
A view for an explanation of how a deflection is given to the pellicle frame according to the present invention.

Next, FIG. 7 is a drawing showing another example of how a deflection is given to a pellicle frame. In this method, as shown in FIG. 7, a preform plate 71 is initially given a deflection, and then it is cut to a pellicle frame shape. The deflected preform plate 71 is flattened and fixed by bolts 74 to lie closely on a table 75 of a tooling machine, and it is cut by a cutting edged tool 72. After this tooling, the bolts 74 are removed and a pellicle frame 73 with deflection is obtained.

If the preform plate is set to the equipment of FIG. 6 for deflection, a large load is required so that a large-scale facility can be necessary such as a large-sized press machine. However, in the case of the tooling method of FIG. 7, except for the difference in material, tooling can be conducted in just the same manner as in the case of a pellicle frame, so that the operation becomes simple and more suitable for a mass production.

Figure 8:
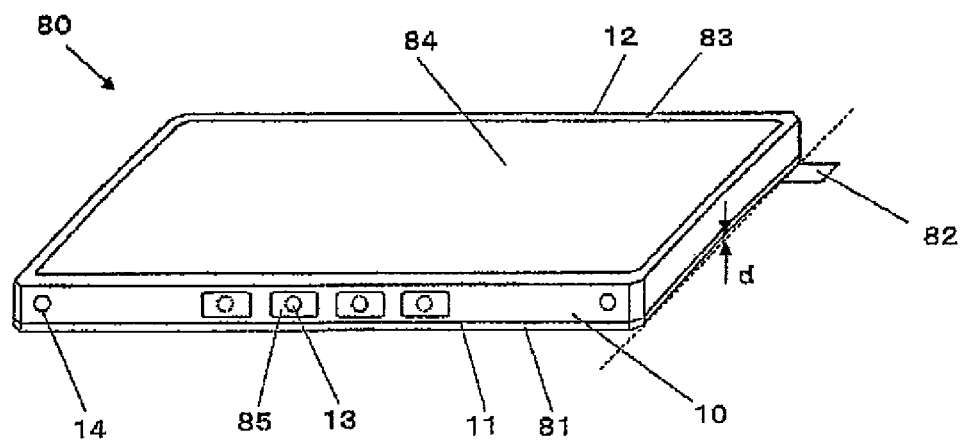
[FIG. 8]
A perspective view of the pellicle according to the present invention.

FIG. 8 is a perspective view of a pellicle 80, which is made with a pellicle frame 10. Mask-bonding agglutinant layer 81 is formed on an annular face of the pellicle frame 10; it can be formed by directly applying an agglutinant such as an acrylic agglutinant, a robber agglutinant, a silicone agglutinant or a hot melt agglutinant or alternatively it can be a double-sided adhesive tape consisting of a flexible base film, made of a foam material or the like, with both sides coated with a thin agglutinant layer.

The more uniform the thickness of this mask-bonding agglutinant layer 81 is, that is, the more uniform the height of the mask-bonding agglutinant layer 81 is from the surface of the pellicle frame 10, the better it is, even if the pellicle frame 10 is deflected; also, the higher the flatness of the surface of the mask-bonding agglutinant layer 81 becomes after its flattening treatment, the better it is. Normally, for the purpose of protecting the surface of the mask-bonding agglutinant layer 81, a separator 82 is laid on it, which 82 is a PET film of a thickness of 50-300 micrometers with its surface rendered to have a releasing property; but this can be omitted if a devised custody or housing method can obsolete it.

The width of a bar of the pellicle frame 10 can be determined variously in response to requirements. It can be different between the long side bars and the short side bars; but the width of the mask-bonding layer 81 is preferably uniform irrespective of whether on the long side bars or short side bars. If the width of the mask-bonding layer 81 is not uniform, the control of the pressure applied at the time of pellicle adhesion to the photomask becomes complicated.

It is also preferable to apply a tacky substance (not shown) such as acrylic agglutinant and silicone agglutinant to the inner wall of the pellicle frame 10 so as to capture foreign materials. It is preferable too to form a layer of non-tacky resin (not shown) such as acrylic resin and fluorine-containing resin on the inner wall of the pellicle frame 10 only or all the surface of it so as to prevent generation of dust. For the formation of layers of such tacky substance and non-tacky resin, any conventionally used known method can be used such as spraying, dipping, powder coating, electrodeposition coating and the like.

The material to make the pellicle membrane 84 can be selected from a cellulose group resin, a fluorine-containing resin, or the like, which is optimum for the kind of exposure light source used; and the membrane is preferably to have an optimum thickness selected from a range of about 0.1-10 micrometers from the viewpoints of transmittance, mechanical strength and the like. Further, it is possible to coat an anti-reflection layer, if need be. Also, a pellicle membrane-bonding adhesive layer 83 can be made of any known adhesive such as an acrylic adhesive, a fluorine-containing adhesive, or a silicone adhesive.

In the case where a vent hole 13 is provided, there is a need to cover it from outside with a filter 85 so as to prevent an entrance of a dust particle; the position and the number of the vent hole 13 and the filter 85 can be determined based on the degree of ventilation required, handling convenience, and the like.

EXAMPLES

Here an example of embodying the present invention is explained in detail, and one should not construe the invention to be limited thereto.

Firstly, the pellicle frame 10 as shown in FIGS. 1 through 3 was prepared. The pellicle frame 10 was cut out from a preform plate of aluminum alloy A5052 by machining, and its dimension was such that the lengths of the short side bars and long side bars were 1146 mm and 1366 mm, respectively, and the widths of the short side bars and long side bars were both 12 mm, and the height of the frame was 5.8 mm. Each of the long side bars of the pellicle frame 10 was provided with vent holes 13 having a diameter of 1.5 mm, and also with non-penetrant handling holes 14 near the corners; also the edges of the frame were given a chamfer of C: 0.1-0.2 mm or so.

Next, this pellicle frame 10 was set to the deformation processing mold 61, shown in FIG. 6, and each press means 63 positioned near the ends of the mold 61 was forced downward by means of bolts (not shown), whereby a deflection was imparted to the two short side bars of the frame 10. After this processing, the deflection amounts at the middle points of the short side bars were measured by the method shown in FIG. 5, and both resulted in 0.72 mm, (the pellicle membrane is adhered to the convex side of the frame); thus the ratio of the deflection amount to the length of the short side bar was 0.063%. Then, the entire surface was matted to a degree of Ra=0.6 or so by sandblasting, and then subjected to a black color alumite anodizing.

In this example, a pellicle 80, like the one shown in FIG. 8, was manufactured using this pellicle frame 10, and the procedure of this manufacturing will be explained herein below.

Firstly, the pellicle frame 10 was thoroughly washed with a surface-active agent and pure water, and then dried. Then, as the mask-bonding agglutinant a silicone agglutinant (KR3700, a product name of Shin-Etsu Chemical Co., Ltd.) was applied to form a layer 81 by means of an air pressure type dispenser mounted on an orthogonal tri-axial robot. A molding face of a plane jig having a flatness of 10 micrometers was pressed closely to that face of the mask-bonding agglutinant layer 81 which was not in contact with the pellicle frame, and thus the agglutinant layer 81 received a squeeze molding, and as the result the agglutinant layer 81 had a height of 1.2 mm and the squeeze-molded face got a flatness of 30 micrometers.

Then, as the pellicle membrane-bonding adhesive a fluorine-containing resin (CYTOP, a product name of ASAHI GLASS CO., LTD.) was applied to a pellicle membrane-receiving face 12, which is on the other side of the face 11 bearing the agglutinant layer 81, by means of an air pressure type dispenser mounted on an orthogonal tri-axial robot. Then, the pellicle frame 10 was heated to 130 degrees C. to thereby dry the adhesive by evaporating its solvent and at the same time cure the silicone agglutinant by heat, and thus the pellicle membrane-bonding adhesive layer 83 and the mask-bonding agglutinant layer 81 were completed.

Then for the protection of the surface of the mask-bonding agglutinant layer 81, a separator 82, which was a 125-micrometer-thick film of PET coated with a releasing agent, was laid over the agglutinant layer 81. Next, using a double-sided adhesive tape, filters 85 consisting of a PTFE porous film were glued to cover up the vent holes 13 made in the longer side bars.

The pellicle membrane 84 was made in the following procedure. First, a fluorine-containing resin (CYTOP, a product name of ASAHI GLASS CO., LTD.), as the material to make the pellicle membrane, was made into a membrane by spin coating method on a quartz base plate, whose molding face had been ground to a high flatness. After eliminating the solvent by drying, the membrane was peeled off the quartz base plate and the peel had a thickness of about 4 micrometers; this peel was adhered to the pellicle membrane-bonding layer 83 on the pellicle frame 10 to become the pellicle membrane 84, and the excessive part of the pellicle membrane 84 which extended beyond the outer extremity of the pellicle frame 10 was trimmed off by a cutter whereby the pellicle 80 was completed.

Figure 9:
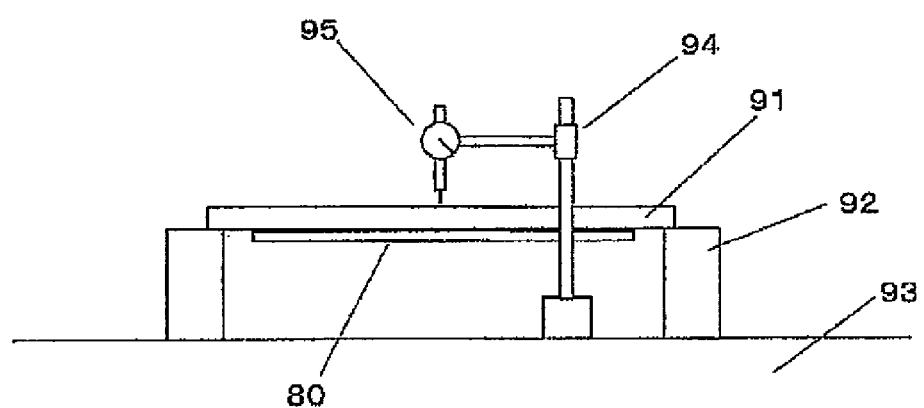
[FIG. 9]
A schematic view for an explanation of how to evaluate the pellicle.

FIG. 9 is a schematic drawing to show how to evaluate the pellicle 80; the evaluation of the pellicle 80 was conducted in the following manner.

First, a photomask base plate 91 was procured, which was made of quartz glass and measured 1220 mm×1400 mm×13 mm (thickness) and had a flatness of 20 micrometers (when standing vertically); this photomask base plate 91 was put on a support work 92 made of a stainless steel in a manner such that only that portion of each longer side of the photomask base plate 91 which is within 10 mm from the edge line, lies on the support work 92; and this set was placed horizontally on a surface plate 93 having a flatness of 5 micrometers. Next, using a dial gauge 95 supported by a stand 94, the distance between the surface plate 93 and the upper face of the photomask base plate 91 was measured at a middle position of each short side of the photomask base plate 91 but 50 mm removed inward from the edge line, and the results showed that the amount of the deflection at the middle point of the short sides of the photomask base plate 91 was 0.632 mm and 0.615 mm, respectively.

Next, the pellicle 80, as prepared in the manner explained above, was adhered centrally to the same photomask base plate 91 under a pressure of 210 kgf, and the set was placed on the same surface plate 93. Then, adopting the same procedure as in the above measurement of the photomask base plate 91 alone, and using the same dial gauge 95, the distance between the surface plate 93 and the upper face of the photomask base plate 91 was measured at a middle position of each short side of the photomask base plate 91 but 50 mm removed inward from the edge line, and the results showed that the side that had a deflection amount of 0.632 mm before the pellicle adhesion had a deflection amount of 0.635 mm and the other side that had a deflection amount of 0.615 mm before the pellicle adhesion had a deflection amount of 0.610 mm, so that it was found that there was only very scarce change in the deflection amount between before and after the adhesion of the pellicle 80 to the photomask base plate 91.

Therefore it was confirmed that, as shown in the example, if the pellicle 80 is made with a pellicle frame 10 which contains a deflection amount of 0.72 mm in each of its two side bars, and if this pellicle 80 is adhered to the photomask base plate 91, then the influence of the pellicle 80 that works to alter the deflection amount of the photomask base plate 91 is suppressed.

Comparative Example

In this comparative example, adopting the same procedure as in the above-described example, a pellicle frame of the same size having no deflection was made, and a pellicle was constructed by using this pellicle frame and by adopting the same procedure as in the above example. Next, a photomask base plate with the same size as the one used in the above example was prepared, and similarly in the example above, the photomask base plate was measured for its deflection amount at the middle points of its short sides, before and after the pellicle was adhered to it.

The results of the measurement showed that in the case of one short side the amount of deflection changed from 0.603 mm to 0.561 mm and in the case of the other short side, the change was from 0.595 mm to 0.572 mm, so that the adhesion of the pellicle to the photomask base plate caused a substantial change in the deflection amount of the photomask base plate.

REPRESENTATION OF REFERENCE NUMERALS

- 10: pellicle frame
- 11: agglutinant layer-bearing face
- 12: pellicle membrane-receiving face
- 13: vent hole
- 14: handling hole
- 15: imaginary plane containing end edges of a frame raised as a result of deflection
- 41: photomask
- 42: photomask support means
- 43: imaginary plane containing end edges of a photomask raised as a result of deflection
- 51: support means
- 52: standard face
- 53: frame end
- 54: middle point of a side bar
- 61: deformation processing mold
- 62: pellicle frame
- 63: press means
- 71: deflected preform plate
- 72: cutting edged tool
- 73: pellicle frame
- 74: bolt
- 75: table
- 80: pellicle
- 81: mask-bonding agglutinant layer
- 82: separator
- 83: pellicle membrane-bonding adhesive layer
- 84: pellicle membrane
- 85: filter
- 91: photomask base plate
- 92: support work
- 93: surface plate
- 94: stand
- 95: dial gauge
- L: length of said bar
- d: amount of deflection Scopes of what is claimed:

1. A rectangular pellicle frame having a pair of long side bars and a pair of short side bars to which a pellicle membrane is to be adhered, characterised in that at least one pair of the side bars are made to have a deflection in a same direction vertical to the pellicle membrane, and that a ratio of amount of said deflection to length of respective side bar is 0.01 through 1% as measured at the middle points of the bars.

2. The pellicle frame as claimed in claim 1 wherein value of said ratio is within a range of plus/minus 30% of a ratio of amount of maximum self-weight deflection of a photomask in the area overlapped by a pellicle made with said pellicle frame to the applicable side length of the photomask, to which said pellicle is adhered.

3. The pellicle frame as claimed in claim 2 wherein the direction of deflection of the pellicle frame is the same as the direction in which said photomask deflects under its self-weight.

4. The pellicle frame as claimed in claim 2 wherein a height of said pellicle frame is 2 through 10 mm.

5. The pellicle comprising the pellicle frame as defined in claim 2.

6. The pellicle frame as claimed in claim 1 wherein the direction of deflection of the pellicle frame is the same as the direction in which said photomask deflects under its self-weight.

7. The pellicle frame as claimed in claim 6 wherein a height of said pellicle frame is 2 through 10 mm.

8. The pellicle comprising the pellicle frame as defined in claim 6.

9. The pellicle frame as claimed in claim 1 wherein a height of said pellicle frame is 2 through 10 mm.

10. The pellicle comprising the pellicle frame as defined in claim 9.

11. The pellicle comprising the pellicle frame as defined in claim 1.

12. An assembly comprising a photomask and a pellicle, which is adhered to said photomask,
    wherein said pellicle comprises a rectangular frame having a pair of long side bars and a pair of short side bars to which a pellicle membrane is adhered, and at least one pair of the side bars are made to have a deflection in a same direction vertical to the pellicle membrane, before being adhered to said photomask,
    said assembly being characterized in that a ratio of amount of said deflection to length of respective side bar of said frame as measured at the middle points of the bars is within a range of plus/minus 30% of a ratio of amount of maximum self-weight deflection of said photomask to the applicable side length of the photomask.

* * * * *